(12) United States Patent
Herner

(10) Patent No.: US 6,787,466 B2
(45) Date of Patent: Sep. 7, 2004

(54) HIGH THROUGHOUT PROCESS FOR THE FORMATION OF A REFRACTORY METAL NUCLEATION LAYER

(75) Inventor: Scott Brad Herner, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/078,016

(22) Filed: Feb. 15, 2002

(65) Prior Publication Data

US 2003/0157797 A1 Aug. 21, 2003

(51) Int. Cl.$^7$ ............................................. H01L 21/44
(52) U.S. Cl. ...................... 438/685; 438/626; 438/627; 438/637; 438/643; 438/644; 438/648
(58) Field of Search .................... 438/622, 628–629, 438/637–640, 642–648, 652–658, 667–668, 672–675, 685

(56) References Cited

U.S. PATENT DOCUMENTS

| | | | |
|---|---|---|---|
| 5,306,666 A | | 4/1994 | Izumi .......................... 437/192 |
| 5,328,722 A | | 7/1994 | Ghanayem et al. .......... 427/250 |
| 5,429,991 A | | 7/1995 | Iwasaki et al. .............. 437/192 |
| 5,599,639 A | | 2/1997 | Sansone et al. ............... 429/33 |
| 6,107,200 A | * | 8/2000 | Takagi et al. ................ 438/685 |
| 6,287,964 B1 | * | 9/2001 | Cho ............................. 438/643 |
| 6,303,480 B1 | | 10/2001 | Desai et al. ................. 438/584 |
| 6,498,399 B2 | * | 12/2002 | Chung et al. ................ 257/774 |

OTHER PUBLICATIONS

Herner, S.B., et al., "Homogeneous Tungsten Chemical Vapor Deposition on Silane Pretreated Titanium Nitride," Electrochemical and Solid–State Letters, 2 (8) 1999, pp. 398–400.

McInerney, E.J., et al., "Silane Reduced Chemical Vapor Deposition Tungsten as a Nucleating Step in Blanket W," J. Vac. Sci. Technol. B 11 (3), May/Jun 1993, pp. 734–743.

(List continued on next page.)

Primary Examiner—Thanh Nguyen
(74) Attorney, Agent, or Firm—Townsend & Townsend & Crew

(57) ABSTRACT

A method for the formation of a refractory metal nucleation layer (e.g., a tungsten nucleation layer) on a semiconductor device substrate that includes first depositing a metallic barrier layer (e.g., a titanium-nitride barrier layer) on the substrate. Next, the metallic barrier layer is exposed to a silicon-containing gas (e.g., monosilane) to form a layer of silicon (e.g., a monolayer of silicon) on the metallic barrier layer. The layer of silicon is then exposed to a refractory metal-containing gas (e.g., $WF_6$) in a manner such that the refractory metal-containing gas undergoes a reduction reaction with the layer of silicon. The result of this reaction is the formation of a refractory metal layer (e.g., a tungsten metal layer) on the metallic barrier layer. Subsequently, an alternating exposure of the refractory metal layer to the silicon-containing gas and the refractory metal-containing gas is conducted. This alternating exposure deposits additional refractory metal on the refractory metal layer in order to form a refractory metal nucleation layer. Processes according to the present invention employ a relatively high pressure (i.e., between 40 and 300 Torr) during formation of the tungsten nucleation layer. The relatively high pressure facilitates fast reactions and temperature stabilization during formation of the refractory metal nucleation layer and, thus, a high throughput process. In addition, the process can be combined with a conventional tungsten core layer deposition conducted at a relatively high pressure without the need to expend process time cycling between two different deposition pressures, thus providing a high effective throughput.

22 Claims, 4 Drawing Sheets

OTHER PUBLICATIONS

Ramanath, G., et al., "Gas–Phase Transport of $WF_6$ through Annular Nanopipes in TiN During Chemical Vapor Deposition of W on TiN/Ti/$SiO_2$ Structures for Integrated Circuit Fabrication," Appl. Phys. Lett. 69 (21), 18 Nov. 1996, pp. 3179–3181.

Nanda, Arun K., et al., "Characterization of the Nucleation and Growth Process of CVD–W on TiN Substrates," Mat. Res. Soc. Symp. Proc. vol. 382, 1995 Materials Research Society, pp. 401–406.

Herner, S.B., et al., "Volcano Reactions in Oxide Vias Between Tungsten CVD and Bias Sputtered TiN/Ti Films," Journal of the Electrochemical Society, 147 (5) 2000, pp. 1982–1987.

* cited by examiner

HIGH THROUGHPUT PROCESS FOR THE FORMATION OF A REFRACTORY METAL NUCLEATION LAYER

BACKGROUND OF THE INVENTION

1. Field of the Invention

The present invention, in general, relates to semiconductor device manufacturing methods and, in particular, to methods for the formation of refractory metal nucleation layers.

2. Description of the Related Art

Semiconductor devices (e.g., silicon integrated circuits) often include metal interconnect structures that serve a variety of purposes, including carrying electrical signals between individual device elements, the provision of power, supplying a connection to ground and furnishing a connection to external apparatus. Such interconnect structures include horizontal patterned metal layers separated by inter-metal dielectric (IMD) layers formed of, for example, silicon dioxide ($SiO_2$). The horizontal patterned metal layers are connected by vertical metal interconnects (referred to as vias) formed in the IMD layer.

One form of conventional via includes a titanium-nitride (TiN) barrier layer and a tungsten (W) core. The tungsten core is normally formed using a tungsten chemical vapor deposition (CVD) reaction. It is difficult to initiate the deposition of a high quality tungsten layer on a TiN barrier layer using tungsten hexafluoride ($WF_6$) and hydrogen ($H_2$) gases only, as this approach results in a long "incubation time," i.e., the time between when the gases are introduced to a substrate (e.g., a silicon wafer) and when the deposition is initiated. This approach also results in a tungsten layer with poor thickness uniformity. These problems can be overcome using a CVD reaction that involves reduction of $WF_6$ with monosilane ($SiH_4$) to deposit a tungsten nucleation layer on the TiN barrier layer. Tungsten deposition by reduction of $WF_6$ with $SiH_4$ has little or no incubation time on a TiN barrier layer, and the resulting layer has minimal thickness nonuniformity. Tungsten is subsequently deposited on the tungsten nucleation layer using, for example, the aforementioned tungsten CVD reaction of $WF_6$ and $H_2$.

When tungsten layers are deposited by reduction of $WF_6$ with $SiH_4$, the reaction is typically conducted at a relatively low pressure (e.g., 40 Torr or less) to avoid gas phase nucleation and resultant particle formation. The tungsten deposition rate in this CVD process is determined, among other factors, by the pressure at which the reaction is carried out. By reacting at a relatively low pressure, a low deposition rate is achieved. Since the tungsten nucleation layer is deposited at a relatively low pressure and the tungsten core may be formed at a relatively high pressure (using, for example, the reduction of $WF_6$ by $H_2$), process time can be expended cycling and stabilizing between the two deposition pressures. This pressure cycling decreases the effective throughput of the process.

Still needed in the field, therefore, is a high throughput process for forming a refractory metal nucleation layer. In addition, the process should have a high effective throughput.

BRIEF SUMMARY OF THE INVENTION

The present invention provides a process for forming a refractory metal nucleation layer (e.g., a tungsten nucleation layer) with both a high throughput and a high effective throughput. Processes according to the present invention employ a relatively high pressure (i.e., a pressure between 40 Torr and 300 Torr) during formation of the refractory metal nucleation layer. This relatively high pressure facilitates fast wafer temperature stabilization and fast reactions during formation of the refractory metal nucleation layer and, thus, a high throughput process. In addition, the inventive process can be combined with a conventional tungsten deposition technique (e.g., the hydrogen reduction of tungsten hexaflouride to form a tungsten core layer) conducted at a relatively high pressure without the need to expend process time cycling between two different pressures. The use of a relatively high pressure, therefore, enables a high effective throughput process since the pressure cycling required for a subsequent tungsten core layer deposition is eliminated.

An embodiment of a method for the formation of a refractory metal nucleation layer (e.g., a tungsten nucleation layer) on a semiconductor device substrate includes first depositing a metallic barrier layer (e.g., a titanium-nitride or tantalum-nitride barrier layer) on the semiconductor device substrate. Next, the metallic barrier layer is exposed to a silicon-containing gas (e.g., a silane gas such as monosilane [$SiH_4$]) to form a layer of silicon (e.g., a monolayer of silicon) on the metallic barrier layer. The layer of silicon is then exposed to a refractory metal-containing gas (e.g., tungsten hexaflouride, $WF_6$) such that the refractory metal-containing gas undergoes a reduction reaction with the layer of silicon. The result of this reduction reaction is the formation of a refractory metal layer (e.g., a tungsten metal layer) on the metallic barrier layer. If desired, the silicon-containing gas can be mixed with a nonreactive gas, such as helium or argon, to effectively mix and distribute the silicon-containing gas evenly across the semiconductor device substrate. Subsequently, an alternating exposure of the refractory metal layer to the silicon-containing gas and the refractory metal-containing gas is conducted. This alternating exposure serves to deposit additional refractory metal on the refractory metal layer and thus increase the thickness of the refractory metal layer and form a refractory metal nucleation layer.

By initially forming a layer of silicon on the metallic barrier layer, the uniformity, smoothness and homogeneity of the subsequently formed refractory metal nucleation layer is beneficially improved in comparison to refractory metal nucleation layers formed by conventional processes. Furthermore, by introducing the silicon-containing gas and the refractory metal-containing gas separately, the problem of gas phase nucleation and resultant particle formation at relatively high pressures is eliminated.

A better understanding of the features and advantages of the present invention will be obtained by reference to the following detailed description that sets forth illustrative embodiments, in which the principles of the invention are utilized, and the accompanying drawings.

DESCRIPTION OF THE SPECIFIC EMBODIMENTS OF THE INVENTION

To be consistent throughout the present specification and for clear understanding of the present invention, the following definition is hereby provided for a term used therein:

The term "effective throughput" refers to the throughput of a process including all required overhead time (e.g., pressure cycling and temperature stabilization) when the process is operatively combined with another process.

For illustration and exemplary purposes only, the following description of a specific embodiment of the invention pertains to a process for the formation of a tungsten nucleation layer. This specific process includes the use of a titanium-nitride (TiN) barrier layer as a metallic barrier layer, monosilane ($SiH_4$) as the silicon-containing gas, and tungsten hexafluoride ($WF_6$) as the refractory metal-containing gas. One skilled in the art will recognize, however, that processes according to the present invention are not limited to the use of a TiN barrier layer, $SiH_4$ and $WF_6$ but rather that these serve as representative examples of a metallic barrier layer, a silicon-containing gas and refractory metal-containing gas, respectively.

Figure 1A:
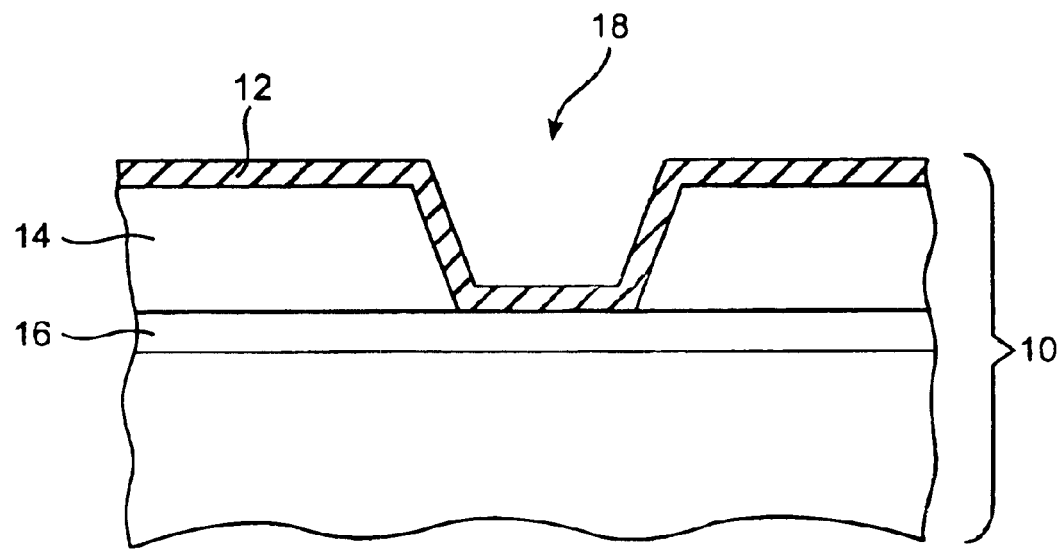
FIGS. 1A–1E are simplified cross-sectional diagrams of a substrate as it is subjected to a sequence of steps in a process according to one exemplary embodiment of the present invention.

FIGS. 1A–1E and FIG. 2 are simplified cross-sectional diagrams and a flow chart, respectively, illustrating a sequence of steps in a process for forming a tungsten nucleation layer on a semiconductor device substrate 10 in accordance with an exemplary embodiment of the present invention. A titanium-nitride (TiN) barrier layer 12 is first deposited on semiconductor device substrate 10, as shown in FIG. 1A and charted in step 50 of FIG. 2.

TiN barrier layer 12 is referred to as a "barrier" layer since it serves to protect underlying semiconductor device substrate layers (e.g., an underlying titanium [Ti] adhesion layer, not shown) from exposure to, and reaction with, tungsten hexafluoride ($WF_6$) gas employed in subsequent processing. TiN barrier layer 12 can be formed by conventional techniques, such as the thermal decomposition of a titanium and a nitrogen-containing precursor (e.g., tetrakis-dimethyl-amido-titanium [TDMAT]) or ion metal plasma (IMP) sputtering.

Semiconductor device substrate 10 can be any suitable substrate employed in semiconductor device manufacturing technology. For example, semiconductor device substrate 10 can be a silicon wafer with a metal interconnect structure thereon. Semiconductor device substrate 10 is depicted in FIG. 1A as including a dielectric layer 14 (e.g., a silicon dioxide [$SiO_2$] layer or a low-k dielectric layer) overlying a metal layer 16 (e.g., an aluminum layer). Dielectric layer 14 is also depicted in FIG. 1A as having a via opening 18 formed therein.

Figure 1B:
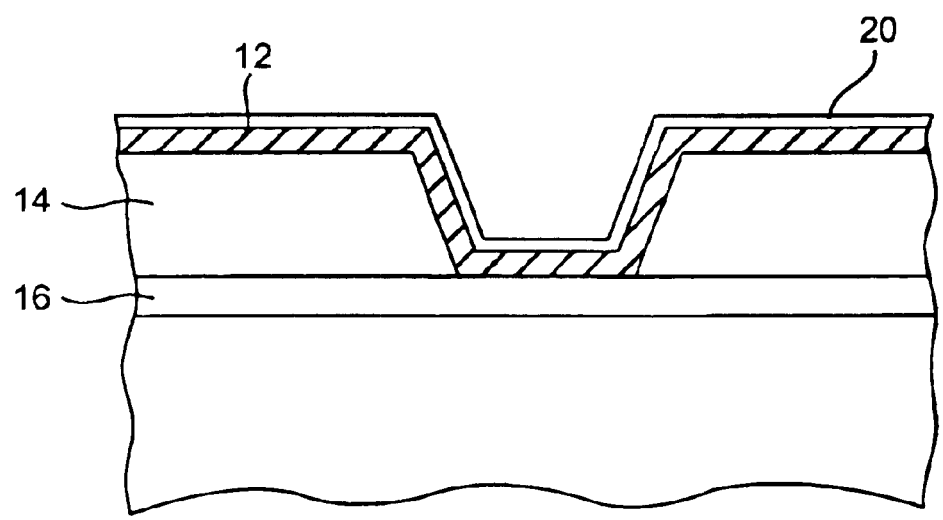
Figure 2:
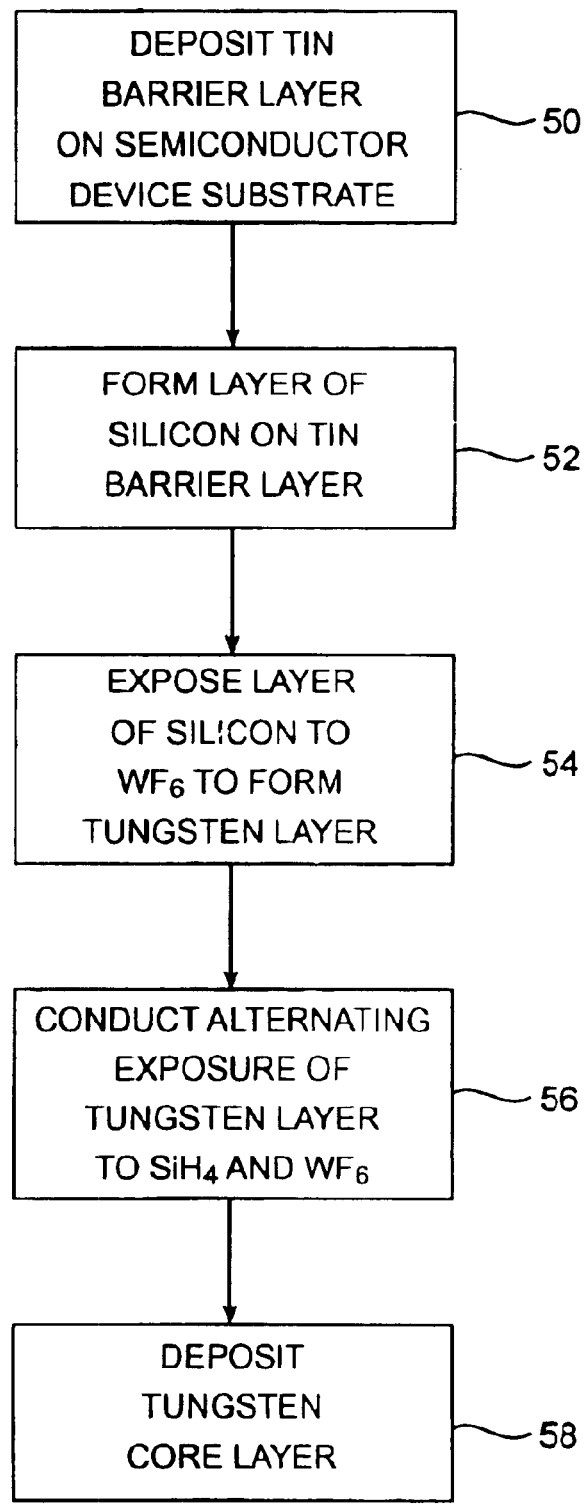
FIG. 2 is a flow chart illustrating the process to which the substrate shown in FIGS. 1A–1E is subjected.

Next, a layer of silicon (Si) 20 is formed on TiN barrier layer 12 by exposing TiN barrier layer 12 to monosilane ($SiH_4$, a member of the silane gas family), as illustrated in FIG. 1B (see also step 52 of FIG. 2). TiN barrier layer 12 can be exposed, for example, to $SiH_4$ under process conditions that result in a silicon surface concentration of $1.5 \times 10^{15}$ atoms/cm$^2$ (approximately a monolayer of silicon.) It is believed that layer of silicon (Si) 20 takes the form of a H-terminated silicon layer that is distinct from absorbed $SiH_4$. However, this belief is not intended to limit the present invention.

Suitable process conditions for the formation of layer of silicon 20 include, for example, a semiconductor device substrate temperature in the range of 425° C. to 475° C., a pressure in the range of 80 Torr to 300 Torr and a $SiH_4$ flow rate in the range of 50 sccm to 1000 sccm for a time period in the range of 10 seconds to 100 seconds. If desired, the $SiH_4$ can be diluted in an inert carrier gas such as argon (Ar). Processes for forming a layer of silicon by $SiH_4$ decomposition on a TiN layer are further described in U.S. Pat. No. 6,303,480 B1 to Desai et al., which is hereby incorporated in full be reference.

Figure 1C:
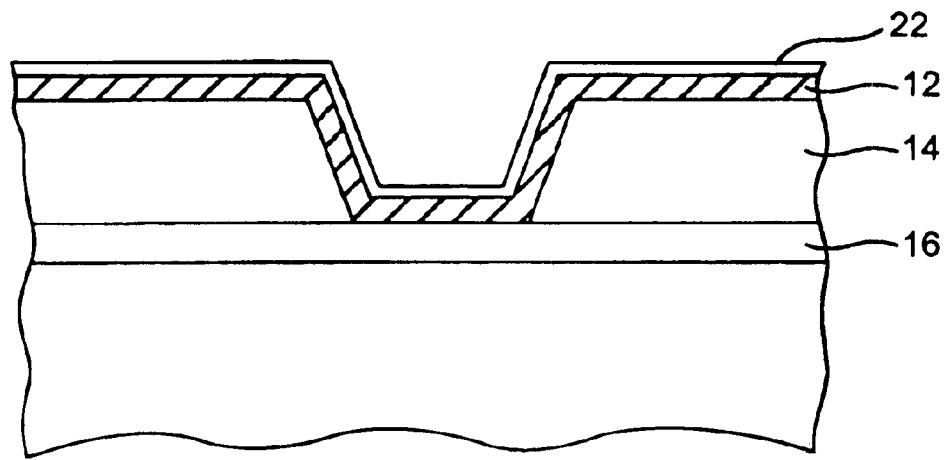

Following the exposure of TiN barrier layer 12 to silane, layer of silicon 20 is exposed to tungsten hexafluoride ($WF_6$, a tungsten source gas). This exposure is conducted such that the $WF_6$ undergoes a reduction reaction with the layer of silicon, resulting in the formation of a tungsten layer 22 on TiN barrier layer 12. This exposure is charted as step 54 in FIG. 2 and the resulting structure is illustrated in FIG. 1C.

In the circumstance that approximately a monolayer of silicon was formed on TiN barrier layer 12, the appropriate exposure of that monolayer of silicon to $WF_6$ can result in the formation of approximately a monolayer of tungsten on the surface of TiN barrier layer 12. The combination of a tungsten layer that is a monolayer in thickness on a TiN barrier layer is essentially a tungsten-terminated TiN barrier layer.

Sputtering ion mass spectroscopy (SIMS) depth profiling of a tungsten layer formed in accordance with the present invention indicated that the concentration of silicon incorporated into the tungsten layer was negligible. Therefore, it is postulated without being limiting that the monolayer of silicon is removed as an $SiHF_3$ byproduct during the formation of the tungsten layer.

Conditions which can be used to form tungsten layer 22 include, for example, a semiconductor device substrate temperature in the range of 375° C. to 475° C., a pressure in the range of 40.5 Torr to 300 Torr and a $WF_6$ flow rate in the range of 5 sccm to 30 sccm for a time period in the range of 1 second to 10 seconds. If desired, the $WF_6$ can be diluted in argon (Ar). For example, 10 sccm of $WF_6$ can be diluted in 500 sccm of Ar.

An excessive exposure of layer of silicon 20 to $WF_6$ can result in a deleterious penetration of $WF_6$ through TiN barrier layer 12. Once apprised of the present disclosure, one skilled in the art will can determine acceptable process conditions (e.g., temperature, pressure, time and $WF_6$ flow rate) that avoid such a penetration while forming tungsten layer 22.

One skilled in the art will recognize that the reduction reaction between $WF_6$ and the layer of silicon is essentially a surface reaction. This enables the use of a relatively high pressure to provide a relatively fast reaction, and thus a high throughput, while avoiding undesirable gas phase nucleation and the formation of particles. In addition, the use of a relatively high pressure decreases the time required to stabilize at the required process temperature, as a high pressure yields faster heat transfer from the substrate and walls through the gases to the semiconductor device substrate. This serves to further decrease process time and provide a high throughput process for the formation of a tungsten nucleation layer.

Figure 1D:
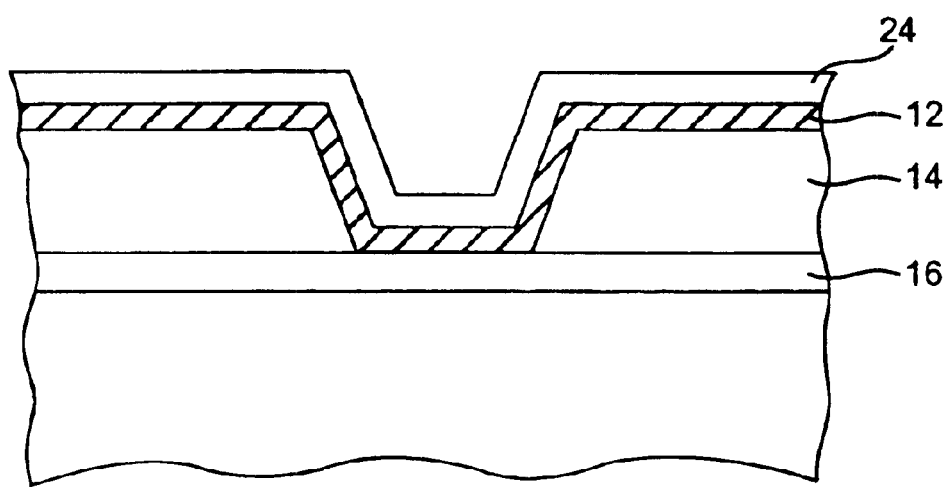

Next, at step 56 of FIG. 2, an alternating exposure of tungsten layer 22 to $SiH_4$ and $WF_6$ is conducted to deposit additional tungsten on tungsten layer 22 and, thereby, form tungsten nucleation layer 24 (see FIG. 1D). The phrase "alternating exposure" refers to a process sequence wherein: (a) tungsten layer 22 is exposed to $SiH_4$ to form a silicon layer on tungsten layer 22; (b) the $SiH_4$ is purged from a reactor, in which the inventive process is being conducted; (c) the tungsten layer (which has been exposed to $SiH_4$ and, therefore, has a silicon layer on its surface) is exposed to $WF_6$ such that the $WF_6$ is reduced by the silicon layer, thus depositing additional tungsten on tungsten layer 22; (d) the $WF_6$ is purged from the reactor; and (e) steps (a) through (d) are then repeated as necessary to form a tungsten nucleation layer of a desired thickness.

The process conditions used during the alternating exposure can be identical to those described above with respect to the exposure of the TiN barrier layer to SiH$_4$ and the exposure of the layer of silicon to WF$_6$. However, it has been determined that then formation of a silicon layer on a tungsten layer takes relatively less time than the formation of a silicon layer on a TiN layer. Therefore, tungsten layer 22 can, for example, be exposed to SiH$_4$ for as little as 2 seconds.

Purging of the reactor can be accomplished by stopping the flow of reactive gases (e.g., WF$_6$ or SiH$_4$) and continuing or initiating the flow of an inert "carrier" gas, such as argon. The carrier gas flow can be increased during the purging step to decrease the purge time necessary to evacuate the reactive gas. Exemplary purge conditions are 2000 sccm of Ar for 2 seconds.

In the circumstance that the alternating exposure step employs a SiH$_4$ exposure that forms a silicon monolayer(s), each exposure to WF$_6$ will deposit an additional monolayer of tungsten on tungsten layer 22. Tungsten nucleation layer 24 can be 20 to 100 angstroms (A) in thickness. Since a monolayer of tungsten is approximately 3 Å thick, the alternating exposure step can include one to 7 alternating exposures to SiH$_4$ and WF$_6$ to deposit a continuous tungsten nucleation film of approximately 20 Å in thickness. A 20 Å thick tungsten nucleation layer can provide as good or better fluorine barrier properties as 100 Å of TiN deposited by MOCVD methods.

Figure 1E:
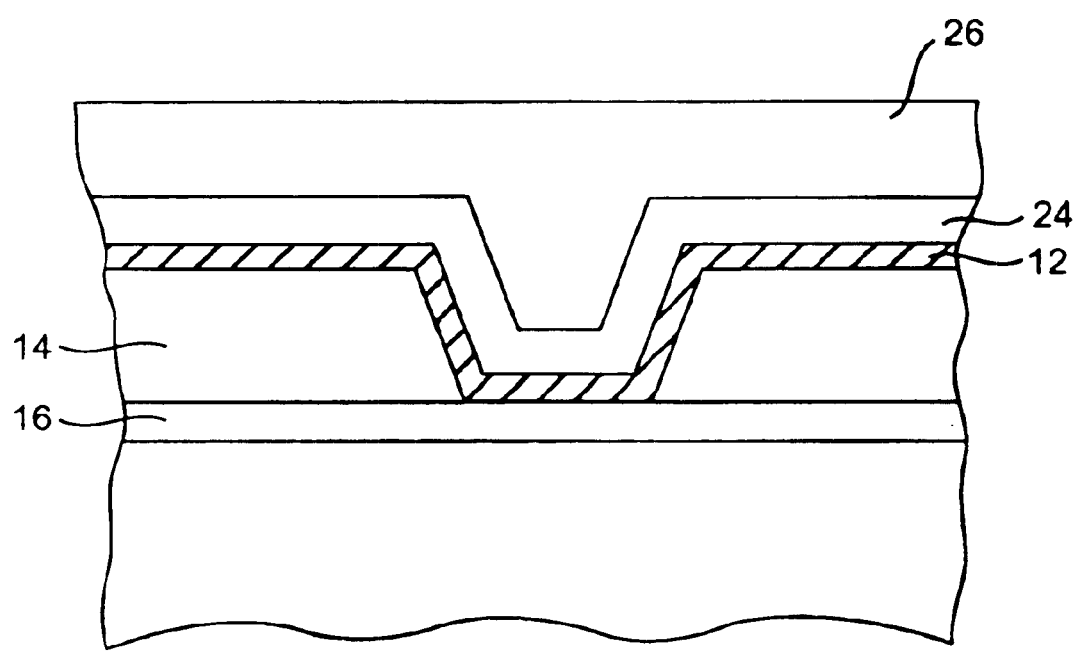

Next, a tungsten core layer 26 is deposited on tungsten nucleation layer 24 using any of a number of conventional tungsten CVD reactions that are known to those of skill in the art including, for example, those that involve the reduction of WF$_6$ by H$_2$ (see FIG. 1E and step 58 of FIG. 2). The deposition of tungsten core layer 26 can be conducted using conventional tungsten CVD reaction conditions. For example, the tungsten CVD reaction can be conducted at a semiconductor device substrate temperature in the range of 375° C. to 475° C., a pressure in the range of 1 Torr to 300 Torr, a WF$_6$ flow rate in the range of 1 sccm to 1000 sccm, and an H$_2$ flow in the range of 10 sccm to 20,000 sccm. If desired, an inert carrier gas, such as argon, can be employed during the deposition of tungsten core layer 26, to more effectively mix and distribute the gases on the wafer.

Processes according to the present invention provide several benefits over conventional processes for the formation of a tungsten nucleation layer. First, the process conditions used to form the tungsten nucleation layer can be conducted at a relatively high pressure (i.e., at a pressure in the range of 40 Torr to 300 Torr). This pressure produces a fast deposition rate and thus increases process throughput in comparison to conventional processes for the formation of a tungsten nucleation layer. Furthermore, by avoiding the simultaneous presence of WF$_6$ and SiH$_4$ in the process chamber, gas phase nucleation and hence particle formation is avoided even though the process is conducted at a relatively high pressure.

Second, the use of a relatively high pressure reduces the amount of time required to reach the desired process temperature since heat transfer is improved at relatively high pressures. This provides a further increase in process throughput compared to conventional processes.

Third, since the pressure employed for formation of the tungsten nucleation layer can be relatively high, tungsten nucleation layer formation processes according to the present invention can be combined with a conventional tungsten CVD reaction (e.g., H$_2$ reduction of WF$_6$) for the formation of a tungsten core layer at a relatively high deposition rate. By running the inventive process and the conventional tungsten CVD reaction at the same pressure, unnecessary pressure cycling is avoided and a high effective throughput attained.

Fourth, by initially forming a layer of silicon on the TiN barrier layer, the smoothness, uniformity and homogeneity of the subsequently formed tungsten nucleation layer is improved compared to conventional tungsten nucleation layer formation processes.

The gas flow rates recited and described above are optimized for processes run in a Centura 5200 WxZ chamber manufactured by Applied Materials and outfitted for 200 mm wafers. One skilled in the art will recognize that the rates, at which various precursor gases in the process are introduced, are in part chamber specific and will vary if chambers of other designs and/or volumes are employed.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method for the formation of a refractory metal nucleation layer on a semiconductor device substrate, the method comprising:

depositing a metallic barrier layer on the semiconductor device substrate;

exposing the metallic barrier layer to a silicon containing gas to form a layer of silicon on the metallic barrier layer;

purging the silicon containing gas;

exposing the layer of silicon to a refractory metal containing gas such that the refractory metal containing gas undergoes a reduction reaction with the layer of silicon resulting in the formation of a refractory metal layer on the metallic barrier layer;

purging the refractory metal containing gas; and conducting an alternating exposure of the metallic refractory layer to the silicon containing gas and the refractory metal containing gas to deposit additional refractory metal on the refractory metal layer and thereby increase the thickness of the refractory metal layer and thereby form a refractory metal nucleation layer.

2. The method of claim 1 further comprising, during the depositing step, depositing a titanium-nitride (TiN) barrier layer.

3. The method of claim 1 further comprising, during the depositing step, depositing a tantalum-nitride (TaN) barrier layer.

4. The method of claim 1, wherein the silicon-containing gas is a silane gas and the refractory metal layer is a tungsten layer.

5. The method of claim 4, wherein the silicon containing gas is monosilane and the refractory metal containing gas is WF$_6$.

6. The method of claim 2, further comprising during the depositing step, depositing a TiN layer with a thickness in the range of 20 angstroms to 1000 angstroms.

7. The method of claim 1, wherein the first exposing step forms approximately a monolayer of silicon on the metallic barrier layer.

8. The method of claim 1, wherein the first exposing step is conducted at a pressure in the range of 40 Torr to 300 Torr.

9. The method of claim 1, wherein the second exposing step is conducted at a pressure in the range of 40 Torr to 300 Torr.

10. The method of claim 4, wherein the conducting step forms a tungsten nucleation layer with a thickness in the range of 20 angstroms to 1000 angstroms.

11. The method of claim 4, further comprising during the conducting step:
exposing the tungsten layer to the silane gas to form a silicon layer on the tungsten layer;
exposing the tungsten layer, which has been exposed to the silane gas to form a silicon layer thereon, to a tungsten containing gas such that the tungsten containing gas undergoes a reduction reaction with the silicon layer, thereby depositing tungsten on the tungsten layer and increasing the thickness of the tungsten layer; and
repeating the step; of exposing of the tungsten layer to the silane gas and exposing the tungsten layer to the tungsten containing gas until the tungsten layer has been increased in thickness sufficiently to function as a tungsten nucleation layer.

12. The method of claim 11, further comprising during the repeating step, repeating the steps a number of times in the range of one to ten.

13. The method of claim 11, further comprising after the conducting step, depositing a tungsten core layer on the tungsten nucleation layer.

14. The method of claim 13, wherein the depositing of the tungsten core layer employs a tungsten chemical vapor deposition reaction wherein tungsten hexafluoride is reduced with hydrogen ($H_2$).

15. The method of claim 13 wherein the step of depositing a tungsten core layer is conducted at a pressure in the range of 1 Torr to 300 Torr.

16. The method of claim 15, wherein the first exposing step, the second exposing step, the conducting step and the depositing step are all conducted at a pressure in the range of 40 Torr to 300 Torr.

17. The method of claim 15, wherein the first exposing step, the second exposing step, the conducting step and the depositing step are all conducted at a single pressure in the range of 40 Torr to 300 Torr.

18. A method for the formation of a tungsten nucleation layer on a semiconductor device substrate, the method comprising:
depositing a titanium-nitride (TiN) barrier layer on the semiconductor device substrate;
exposing the TiN barrier layer to silane ($SiH_4$) to form a layer of silicon on the TiN barrier layer;
purging the silane;
exposing the layer of silicon to tungsten hexaflouride ($WF_6$) such that the $WF_6$ undergoes a reduction reaction with the layer of silicon resulting in the formation of a tungsten layer on the TiN barrier layer;
purging the tungsten hexafluoride, and
conducting an alternating exposure of the tungsten layer to $SiH_4$ and $WF_6$ to deposit additional tungsten on the tungsten layer and thereby increase the thickness of the tungsten layer and faint a tungsten, nucleation layer; and depositing a tungsten core layer on the tungsten nucleation layer using a tungsten chemical vapor deposition reaction wherein $WF_6$ is reduced with $H_2$.

19. The method of claim 18, wherein the first exposing step, the second exposing step, the conducting step and the depositing step are all conducted at a pressure in the range of 40 Torr to 300 Torr.

20. The method of claim 18, wherein the first exposing step, the second exposing step, the conducting step and the depositing step are all conducted it a single pressure in the range of 40 Torr to 300.

21. A method for the formation of a refractory metal nucleation layer on a semiconductor device substrate, the method comprising:
depositing a metallic barrier layer on the semiconductor device substrate;
exposing the metallic barrier layer to a silicon containing gas to form a layer of silicon on the metallic barrier layer;
purging the silicon containing gas; and
exposing the layer of silicon to a refractory metal containing gas such that the refractory metal containing gas undergoes a reduction reaction with the layer of silicon resulting in the formation of a refractory metal layer on the metallic barrier layer.

22. A method for the formation of a tungsten nucleation layer on a semiconductor device substrate, the method comprising:
depositing a titanium-nitride (TiN) barrier layer on the semiconductor device substrate,
exposing the TiN barrier layer to silane ($SiH_4$) at a pressure in the range of 40 Torr to 300 Torr to form a layer of silicon on the TiN barrier layer, purging the silane;
exposing the layer of silicon to tungsten hexaflouride ($WF_6$) at a pressure in the range of 40 Torr to 300 Torr such that the $WF_4$ undergoes a reduction reaction with the layer of silicon resulting in the formation of a tungsten layer on the TiN barrier layer;
purging the $WF_6$; and
conducting an alternating exposure of the tungsten layer to $SiH_4$ and $WF_6$ at a pressure in the range of 40 Torr to 300 Torr to deposit additional tungsten on the tungsten layer and thereby increase the thickness of the tungsten layer and form a tungsten nucleation layer; and
depositing a tungsten core layer on the tungsten nucleation layer at a pressure in the range of 40 Torr to 300 Torr using a tungsten chemical vapor deposition reaction wherein $WF_6$ is reduced with $H_2$.

* * * * *